(12) United States Patent
Maeda et al.

(10) Patent No.: US 8,531,213 B2
(45) Date of Patent: Sep. 10, 2013

(54) CMOS-INVERTER-TYPE FREQUENCY DIVIDER CIRCUIT, AND MOBILE PHONE INCLUDING THE CMOS-INVERTER-TYPE FREQUENCY DIVIDER CIRCUIT

(75) Inventors: Masakatsu Maeda, Osaka (JP); Mikihiro Shimada, Osaka (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 13/321,009

(22) PCT Filed: Apr. 8, 2010

(86) PCT No.: PCT/JP2010/002579
§ 371 (c)(1),
(2), (4) Date: Nov. 17, 2011

(87) PCT Pub. No.: WO2010/134257
PCT Pub. Date: Nov. 25, 2010

(65) Prior Publication Data
US 2012/0058804 A1  Mar. 8, 2012

(30) Foreign Application Priority Data
May 21, 2009 (JP) ................ 2009-123440

(51) Int. Cl.
H03K 21/00 (2006.01)
H03K 23/00 (2006.01)
H03K 25/00 (2006.01)

(52) U.S. Cl.
USPC ........ 327/115; 327/117; 327/118; 455/127.1; 455/127.2; 455/127.3

(58) Field of Classification Search
USPC ........... 327/115, 117, 118; 455/127.1, 127.2, 455/127.3
See application file for complete search history.

(56) References Cited

U.S. PATENT DOCUMENTS
7,353,007 B2 * 4/2008 Carballo et al. ............ 455/127.2

FOREIGN PATENT DOCUMENTS
JP  62-181524  8/1987
JP  1-303928   12/1989
JP  10-32485   2/1998

OTHER PUBLICATIONS

International Search Report issued May 11, 2010 in corresponding International Application No. PCT/JP2010/002579.
Wen Fang et al., "An Analytical Maximum Toggle Frequency Expression and its Application to Optimizing High-Speed ECL Frequency Dividers", IEEE Journal of Solid-State Circuits, vol. 25, No. 4, Aug. 1990, pp. 920-931.
Chih-Ming Hung et al., "An Ultra Low Phase Noise GSM Local Oscillator in a 0.09-μm Standard Digital CMOS Process with No High-Q Inductors", IEEE Radio Frequency Integrated Circuits Symposium, Jun. 6-8, 2004, pp. 483-486.
Yang-Shyung Shyu et al., "A Process and Temperature Compensated Ring Oscillator", AP-ASIC', 1999, pp. 283-286.

* cited by examiner

Primary Examiner — John Poos
(74) Attorney, Agent, or Firm — Wenderoth, Lind & Ponack, L.L.P.

(57) ABSTRACT

The present invention provides a CMOS-inverter-type frequency divider circuit that can further reduce power consumption.
The CMOS-inverter-type frequency divider circuit includes: a plurality of CMOS inverters that contribute to realizing a frequency division function; a frequency division control section for performing control such that some or all of the plurality of CMOS inverters are intermittently driven at the respective different timings in accordance with an input signal; and a drive power supplying section for supplying powers for driving the plurality of CMOS inverters, and for, based on state information indicating whether VCO sub band selection or normal transmission is performed, switching some or all of the powers for the plurality of CMOS inverters between the VCO sub band selection and the normal transmission.

19 Claims, 8 Drawing Sheets

FIG. 8  PRIOR ART

|  | ECL TYPE<br>LITERATURE 1 | CMOS INVERTER TYPE<br>LITERATURE 2 | CMOS INVERTER TYPE<br>+ VTO (THRESHOLD<br>VOLTAGE) CORRECTION<br>LITERATURE 3 |
|---|---|---|---|
| SUPPLY VOLTAGE | HIGH<br>(BIPOLAR TRANSISTOR) | LOW<br>(CMOS TRANSISTOR) | |
| CURRENT CONSUMPTION | SMALL<br>NOT DEPENDENT ON INPUT FREQUENCY | LARGE (DEPENDENT ON PROCESS RULE)<br>PROPORTIONAL TO INPUT FREQUENCY | |
| VARIATIONS IN FREE-RUNNING FREQUENCIES<br>(MAXIMUM OPERATION FREQUENCIES) | DEPENDENT ON VARIATIONS IN COLLECTOR RESISTANCES<br>(IT IS DIFFICULT TO MAKE FREE-RUNNING FREQUENCIES VARIABLE) | PROPORTIONAL TO CURRENT FLOWING IN INVERTER<br>(LARGELY INFLUENCED BY VARIATIONS IN VTO) | VARIATIONS ARE SUPPRESSED BY VTO CORRECTION |
| Phase Noise | FLOOR NOISE IS LARGE BECAUSE SIGNAL AMPLITUDE IS SMALL OWING TO CIRCUIT CONFIGURATION | FLOOR NOISE IS SMALL BECAUSE SIGNAL AMPLITUDE IS LARGE AS BEING VDD – GND | |

CMOS-INVERTER-TYPE FREQUENCY DIVIDER CIRCUIT, AND MOBILE PHONE INCLUDING THE CMOS-INVERTER-TYPE FREQUENCY DIVIDER CIRCUIT

TECHNICAL FIELD

The present invention relates to a CMOS-inverter-type frequency divider circuit, and a mobile phone including the CMOS-inverter-type frequency divider circuit, and more particularly, to a technique for reducing power consumption in the CMOS-inverter-type frequency divider circuit.

BACKGROUND ART

In recent years, mobile phones have been remarkably prevailing, and various techniques for reducing cost and increasing the life of batteries have been proposed.

In many of transmitters of mobile phones or the like, a plurality of frequency divider circuits having different division ratios are connected after an oscillator, so that the transmitter can deal with a plurality of frequencies for communications by using one oscillator, thereby reducing the number of oscillators and realizing reduction of the size and the cost of a high-frequency IC.

Of frequency divider circuits used in such transmitters, particularly, a frequency divider circuit used in a process of generating a carrier wave performs an extremely high frequency of switching operation, and the power consumption of such a frequency divider circuit is never small. Therefore, it is desired that the power consumption of the frequency divider circuit is reduced in order to increase the life of a battery.

Examples of conventional frequency divider circuits are an ECL-type frequency divider circuit (see Non-Patent Literature 1, FIG. 2), and a CMOS-inverter-type frequency divider circuit (see Non-Patent Literature 2, FIGS. 6 and 8).

In comparison with the ECL-type frequency divider circuit, in the CMOS-inverter-type frequency divider circuit, phase noise is small even when the CMOS-inverter-type frequency divider circuit is operated at a low voltage, and it is possible to reduce current consumption by configuring the CMOS-inverter-type frequency divider circuit through a CMOS fine process. Therefore, the CMOS-inverter-type frequency divider circuit is advantageous in reduction of power consumption. However, even if the latest fine process is used, the current consumption is about several ten mA, and therefore, there is enough room for improvement.

In addition, the CMOS-inverter-type frequency divider circuit has a characteristic that a free-running frequency (maximum operation frequency) differs by as much as about ±50% depending on variations in threshold voltages due to the individual differences of MOS transistors. In order to cope with such a characteristic, it is necessary to set a large design margin so that a frequency divider circuit normally operates even if the free-running frequency of the frequency divider circuit is no more than −50% of an average free-running frequency. However, in this case, a current considerably larger than an average current flows, and the average of the free-running frequency becomes considerably larger than the average of an operation frequency that are originally needed. As a result, unnecessary large currents flow in most of frequency divider circuits, and power is consumed wastefully.

Meanwhile, one of recent papers has reported a CMOS-inverter-type frequency divider circuit having a VT0 correction function of detecting variations in threshold voltages (VT0) due to the individual differences of MOS transistors, and correcting variations in free-running frequencies (see Non-Patent Literature 3, FIG. 5 (VT0 detection circuit)).

FIG. 8 is a diagram showing the comparison among the features of the ECL-type frequency divider circuit, the first CMOS-inverter-type frequency divider circuit, and the second CMOS-inverter-type frequency divider circuit having the VT0 correction function.

CITATION LIST

[Non Patent Literature]

[NPL 1] An Analytical Maximum Toggle Frequency Expression and its Application to Optimizing High-Speed ECL Frequency Dividers (IEEE JOURNAL OF SOLID-STATE CIRCUITS, VOL. 25, NO. 4, AUGUST 1990. pp. 920 to 931)

[NPL 2] An Ultra Low Phase Noise GSM Local Oscillator in a 0.09-μm Standard Digital CMOS Process with No High-Q Inductors (2004 IEEE Radio Frequency Integrated Circuits Symposium. pp 483 to 486)

[NPL 3] A PROCESS AND TEMPERATURE COMPENSATED RING OSCILLATOR (AP-ASIC' 99. pp. 283 to 286)

SUMMARY OF THE INVENTION

Problems to be Solved by the Invention

In view of the above, it may be considered that if, in the CMOS-inverter-type frequency divider circuit, the threshold voltage (VT0) is individually measured, and a free-running frequency is adjusted based on the measured value such that the free-running frequency decreases to the minimum value necessary in normal communications, power consumption can be reduced.

However, in mobile phones, to perform normal communications, a circuit constant of an oscillation circuit is switched by a switch or the like in a stepwise manner, and the relationship between a VCO control voltage and a VCO oscillation frequency is actually measured, whereby an appropriate sub band is selected, that is, VCO sub band selection is performed. In the VCO sub band selection, a high frequency wave which is not used in normal communications can be outputted. Therefore, there is restriction that the free-running frequency of a frequency divider circuit must not be smaller than the maximum frequency that can be outputted in the VCO sub band selection. Owing to the restriction, it is impossible to adjust a free-running frequency such that the free-running frequency decreases to the minimum value necessary in normal communications.

Therefore, even if the free-running frequency is individually adjusted based on the measured value of the threshold voltage, it is impossible to decrease the free-running frequency to the minimum value necessary in normal communication though variations in free-running frequencies due to the individual differences of MOS transistors may be reduced. Therefore, it is desired that a new technique for further reducing power consumption is developed.

Therefore, an object of the present invention is to provide a CMOS-inverter-type frequency divider circuit and a mobile phone including the CMOS-inverter-type frequency divider circuit that can further reduce power consumption in comparison with conventional techniques.

Solution to the Problems

The present invention is directed to a CMOS-inverter-type frequency divider circuit and a mobile phone including the CMOS-inverter-type frequency divider circuit. In order to solve the above problems, a CMOS-inverter-type frequency divider circuit according to the present invention comprises: a plurality of CMOS inverters; a frequency division control section; and a drive power supplying section. The plurality of CMOS inverters contribute to realizing a frequency division function. The frequency division control section performs control such that some or all of the plurality of CMOS inverters are intermittently driven at the respective different timings in accordance with an input signal. The drive power supplying section supplies powers for driving the plurality of CMOS inverters, and based on state information indicating whether VCO sub band selection or normal transmission is performed, switches some or all of the powers for the plurality of CMOS inverters between the VCO sub band selection and the normal transmission.

Preferably, the drive power supplying section may, when the state information indicates that the VCO sub band selection is performed, restrict the powers such that free-running frequencies of the CMOS inverters are not smaller than the maximum frequency that can be used in the VCO sub band selection, and may, when the state information indicates that the normal transmission is performed, restrict the powers such that free-running frequencies of the CMOS inverters are smaller than the maximum frequency that can be used in the VCO sub band selection, and are not smaller than the upper limit frequency of an actual use frequency band.

Preferably, the drive power supplying section may, when the state information indicates that the normal transmission is performed, based on band information indicating whether the actual use frequency band is a first frequency band or a second frequency band, switch, between the first frequency band and the second frequency band, some or all of the powers for the plurality of CMOS inverters such that the free-running frequencies are not smaller than the upper limit frequency of the corresponding one of the first frequency band and the second frequency band.

Preferably, the frequency division control section may include MOS transistors provided in series on power lines of some or all of the plurality of CMOS inverters, and may perform control such that the plurality of CMOS inverters are intermittently driven at the respective different timings, by alternately and repeatedly applying a high voltage and a low voltage to the gates of the MOS transistors in accordance with the input signal. The drive power supplying section may switch the powers by switching a voltage to be applied to the gates between the VCO sub band selection and the normal transmission.

Preferably, the drive power supplying section may switch the powers by switching some or all of supply voltages for the plurality of CMOS inverters between the VCO sub band selection and the normal transmission.

Preferably, the drive power supplying section may include detection means for detecting a threshold voltage of a dummy MOS transistor that does not contribute to realizing the frequency division function, and may correct the individual differences of MOS transistors based on the threshold voltage.

In addition, a mobile phone according to the present invention comprises: the CMOS-inverter-type frequency divider circuit according to the present invention; and a communication circuit for realizing a communication function by using the CMOS-inverter-type frequency divider circuit.

Advantageous Effects of the Invention

As described above, according to the present invention, it is possible to adjust the power consumption of the CMOS inverters in accordance with whether the VCO sub band selection or the normal transmission is performed. Therefore, although conventionally, it is necessary to set the power consumption taking into consideration the maximum frequency in the VCO sub band selection, in the present invention, it is possible to, in the normal transmission, restrict the power consumption almost to its limit without taking into consideration the maximum frequency in the VCO sub band selection. Therefore, the power consumption can be further reduced in comparison with the conventional technique.

In addition, in the case where two bands of a 800 MHz band and a 1.5 GHz band are used as an actual use frequency band as in mobile phones having a second-generation movement communication system which are prevalent at the present time, in the case where three bands of a 800 MHz band, a 1.7 GHz band, and a 2.5 GHz band are used as in mobile phones having a third-generation movement communication system, or in the case where more bands are used, it is possible to restrict the power consumption almost to its limit in each actual use frequency band. Therefore, the power consumption can be more effectively reduced.

In addition, it is also possible to adjust the power consumption of the CMOS inverters based on an actual measurement value of a threshold voltage of the dummy MOS transistor. Therefore, although conventionally, a large design margin needs to be set considering variations in the threshold voltages due to the individual differences of the MOS transistors, in the present invention, it is possible to eliminate the design margin and restrict the power consumption almost to its limit.

BRIEF DESCRIPTION OF THE DRAWINGS

FIG. 8 is a diagram showing the comparison among the features of an ECL-type frequency divider circuit, a first CMOS-inverter-type frequency divider circuit, and a second CMOS-inverter-type frequency divider circuit having a VT0 correction function.

DESCRIPTION OF EMBODIMENTS

[First Embodiment]
<Outlines>

A CMOS-inverter-type frequency divider circuit according to the present embodiment is used for a transmitter of a mobile phone or the like, and supplies as much power as needed depending on time, to each CMOS inverter, thereby realizing reduction of power consumption. More specifically, an input indicating whether the VCO sub band selection or normal transmission is performed is received, whereby the amount of power to be supplied for driving each CMOS inverter is switched between the VCO sub band selection and the normal transmission. Here, particularly, in the normal transmission, the individual differences are corrected based on a threshold value of a dummy MOS transistor, and the gate voltage of a MOS transistor provided in series on a power line of each CMOS inverter is adjusted such that the free-running frequency of each CMOS inverter is smaller than the maximum frequency that can be used in the VCO sub band selection, and is not smaller than the maximum frequency in an actual use frequency band that is used in the normal transmission, whereby the amount of a current flowing in each CMOS inverter is restricted and power consumption is reduced.

<Configuration>

Figure 1:
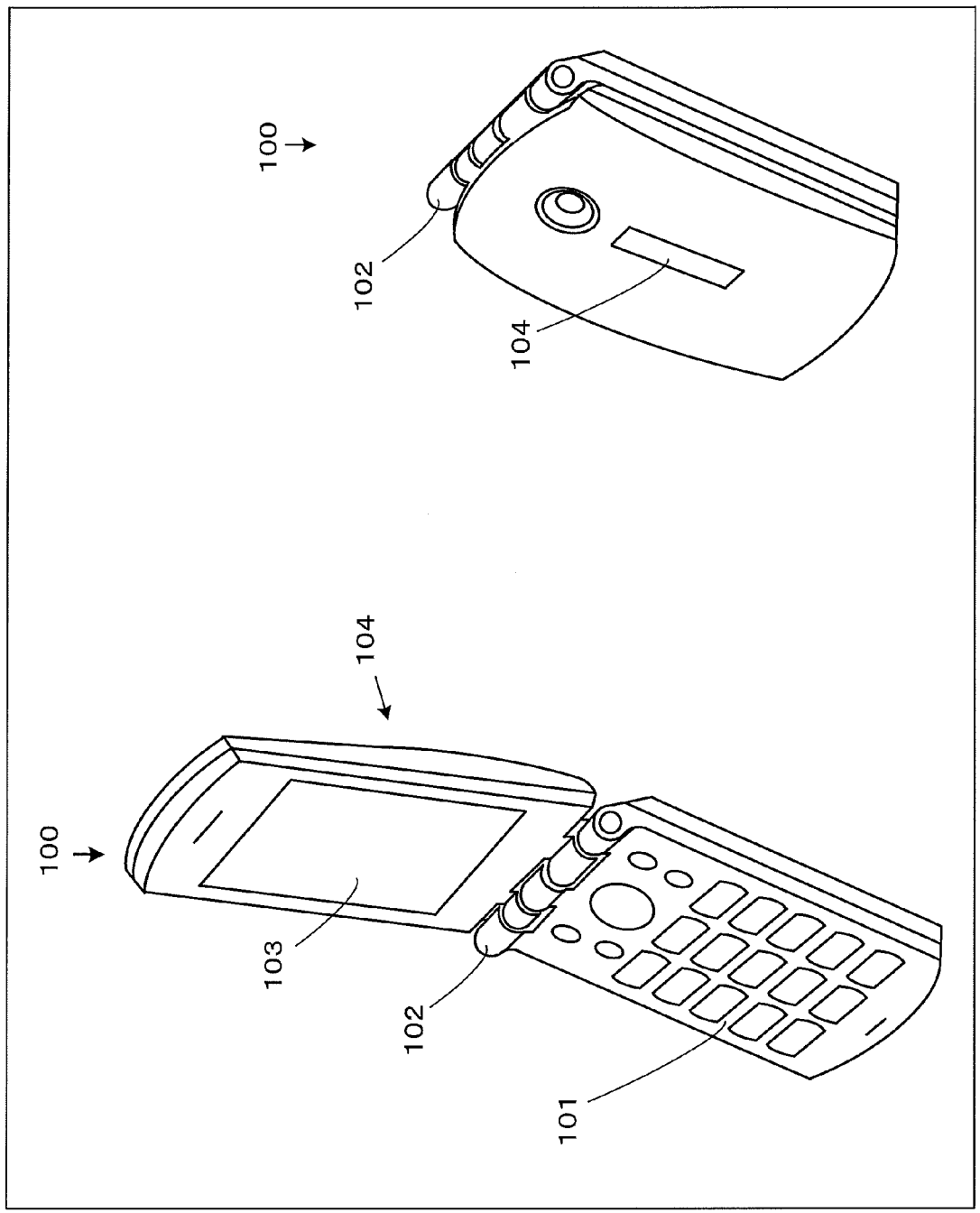
FIG. 1 shows views of the outer appearance of a mobile phone 100 according to the present embodiment.

FIG. 1 shows views of the outer appearance of a mobile phone 100 according to the present embodiment.

It is noted that in FIG. 1, the left view shows the mobile phone 100 that is opened by flip, and the right view shows the mobile phone 100 that is closed and folded by flip.

The mobile terminal apparatus 100 of the first embodiment is, for example, a mobile phone having an open/close function by flip or the like. As shown in FIG. 1, the mobile terminal apparatus 100 includes an operation portion 101, an open/close portion 102, a first display portion 103, and a second display portion 104.

The operation portion 101 includes operation buttons such as a keypad, and receives an operation of a user, an input from a user, and the like.

The open/close portion 102 has an open/close function by flip, for example. If the mobile phone 100 is closed by flip, the second display portion 104 and the operation portion 101 are hidden inside the mobile phone 100, and become invisible to a user.

The first display portion 103 is, for example, a sub LCD, and displays some information that a user may want to know when the mobile phone 100 is closed, such as information about time or a caller of incoming call. The first display portion 103 is provided at a position where a user can see the first display portion 103 irrespective of the open/close state of flip.

The second display portion 104 is, for example, a main LCD, and displays all information that should be displayed, including the information displayed by the first display portion 103.

In addition, the mobile phone 100 further includes a frequency divider circuit inside thereof (not shown).

<Explanation of Principle of Operation of Frequency Divider Circuit>

For the purpose of simplification, the present specification uses, as an example, a divide-by-2 frequency divider circuit of clocked inverter type, whose circuit configuration and operation is relatively easy to understand, to describe the feature of the present invention.

Figure 2:
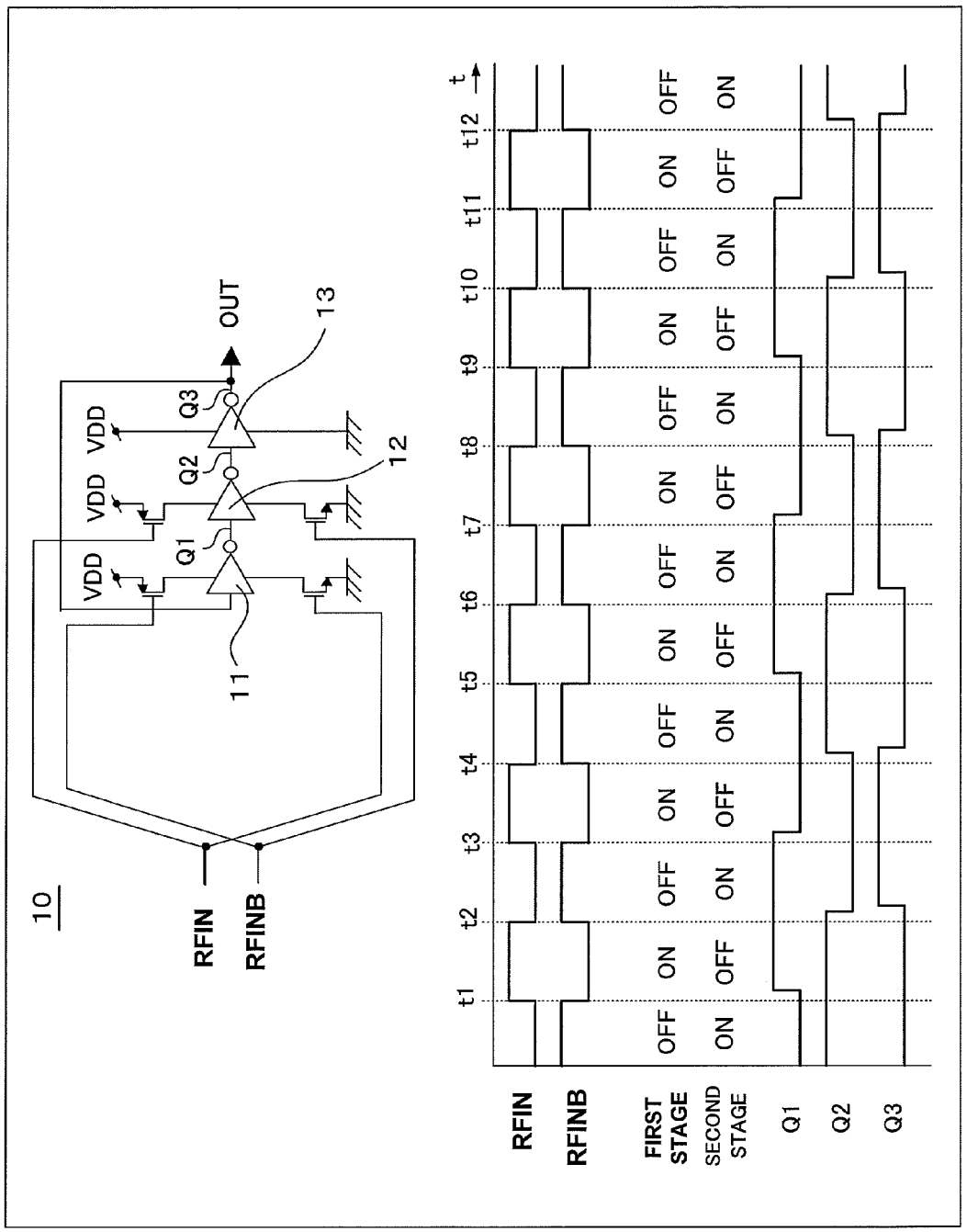
FIG. 2 is a schematic diagram for explaining the principle of operation of a divide-by-2 frequency divider circuit of clocked inverter type.

FIG. 2 is a schematic diagram for explaining the principle of operation of a divide-by-2 frequency divider circuit of clocked inverter type.

As shown in FIG. 2, a divide-by-2 frequency divider circuit 10 of clocked inverter type includes three stages of CMOS inverters 11, 12, and 13 for realizing a frequency division function. An output Q1 of the first stage is connected to an input of the second stage, an output Q2 of the second stage is connected to an input of the third stage, and an output Q3 of the third stage is connected to an input of the first stage. The output Q3 corresponds to a final output signal. In addition, the CMOS inverter 11 of the third stage is directly connected to a VDD and a GND, and the CMOS inverters 11 and 12 of the first and the second stages are connected to VDDs via Pch transistors, and are connected to GNDs via Nch transistors. Therefore, each of the first and the second stages operates when "L" (low) is inputted to the gate of the Pch transistor and "H" (high) is inputted to the gate of the Nch transistor, and each of the first and the second stages keeps its current state when a logic opposite to the above are inputted.

Here, it is assumed that an input signal RFIN is applied to each of the gates of the Nch transistor at the first stage and the Pch transistor at the second stage, and that an input signal RFINB is applied to each of the gates of the Pch transistor at the first stage and the Nch transistor at the second stage. Then, if clock signals having logical values opposite to each other as shown in FIG. 2 are inputted as the input signal RFIN and the input signal RFINB, when the input signal RFIN is "H" and the input signal RFINB is "L", the first stage is ON and the second stage is OFF, and on the other hand, when the input signal RFINB is "H" and the input signal RFIN is "L", the second stage is ON and the first stage is OFF.

With reference to FIG. 2, before the time t1, since the first stage is OFF and the second stage is ON, the logical values of Q1 and Q2 are opposite to each other, and the logical values of Q2 and Q3 are opposite to each other. Therefore, the logical values of Q1 and Q3 are equal to each other. As a result, the logical state of (Q1, Q2, Q3) is either (0, 1, 0) or (1, 0, 1). Here, if the logical state of (Q1, Q2, Q3) is (0, 1, 0), when the first stage is turned on and the second stage is turned off at the time t1, the logical value of Q1 becomes the value opposite to the value of Q3, i.e., changes from 0 to 1, the logical value of Q2 remains as it is to keep 1, and the logical value of Q3 becomes the value opposite to the value of Q2, i.e., keeps 0. As a result, the logical state of (Q1, Q2, Q3) becomes (1, 1, 0). Subsequently, when the first stage is turned off and the second stage is turned on at the time t2, the logical value of Q1 remains as it is to keep 1, the logical value of Q2 becomes the value opposite to the value of Q1, i.e., changes from 1 to 0, and the logical value of Q3 becomes the value opposite to the value of Q2, i.e., changes from 0 to 1. As a result, the logical state of (Q1, Q2, Q3) becomes (1, 0, 1). Subsequently, when the first stage is turned on and the second stage is turned off at the time t3, the logical value of Q1 becomes the value opposite to the value of Q3, i.e., changes from 1 to 0, the logical value of Q2 remains as it is to keep 0, and the logical value of Q3 becomes the value opposite to the value of Q2, i.e., keeps 1. As a result, the logical state of (Q1, Q2, Q3) becomes (0, 0, 1). Subsequently, when the first stage is turned off and the second stage is turned on at the time t4, the logical value of Q1 remains as it is to keep 0, the logical value of Q2 becomes the value opposite to the value of Q1, i.e., changes from 0 to 1, and the logical value of Q3 becomes the value opposite to the value of Q2, i.e., changes from 1 to 0. As a result, the logical state of (Q1, Q2, Q3) becomes (0, 1, 0). Thereafter, the operations at the time t5 are the same as the operations at the time t1, the operations at the time t6 are the same as the operations at the time t2, the operations at the time t7 are the same as the operations at the time t3, and the operations at the time t8 are the same as the operations at the time t4. Also after the time t8, the operations from the time t1 to the time t4 are repeated. In this way, a frequency that is ½ of the frequency of the input signal RFIN is outputted from Q3. It is noted that if the initial logical state of (Q1, Q2, Q3) is (1, 0, 1), the same operations as described above are performed starting from the operations at the time t3. As a result, in either case, a frequency that is ½ of the frequency of the input signal RFIN is outputted from Q3.

The divide-by-2 frequency divider circuit of clocked inverter type exemplified above performs control such that the first stage and the second stage which are some of the three CMOS inverters are intermittently driven at the respective different timings in accordance with the input signal. However, in the case of using another frequency divider circuit having a different frequency division ratio, control can be performed such that all of the CMOS inverters are intermittently driven at the respective different timings.

<Explanation of Frequency Divider Circuit>

Figure 3:
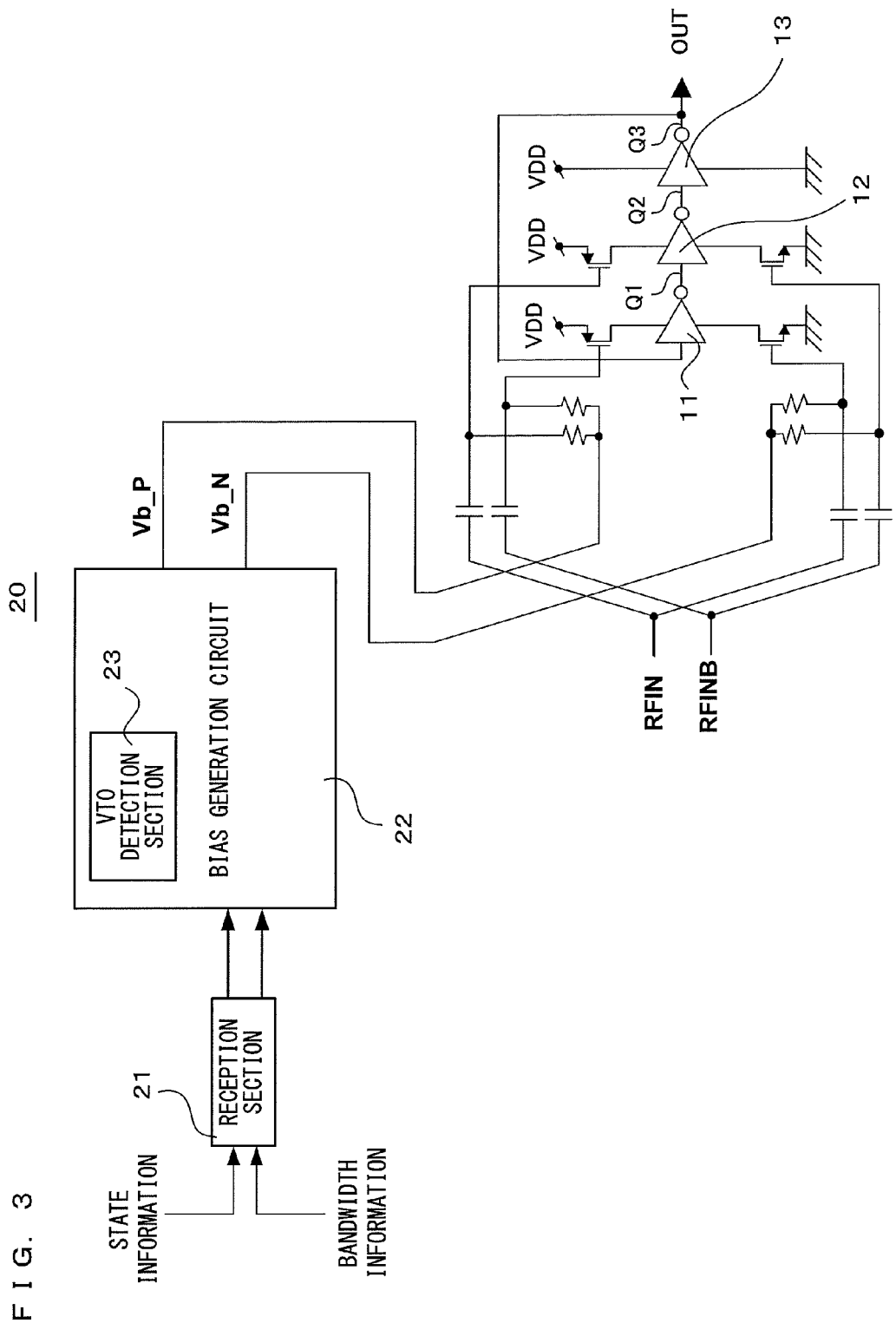
FIG. 3 is a schematic diagram showing a divide-by-2 frequency divider circuit 20 of clocked inverter type according to an embodiment.

FIG. 3 is a schematic diagram showing a divide-by-2 frequency divider circuit 20 of clocked inverter type according to the present embodiment.

As shown in FIG. 3, in addition to the components of the divide-by-2 frequency divider circuit 10 shown in FIG. 2, the divide-by-2 frequency divider circuit 20 includes: a reception section 21 for receiving state information indicating whether the VCO sub band selection or normal transmission is performed, and band information indicating whether an actual use frequency band in the normal transmission is a first frequency band or a second frequency band; and a bias generation circuit 22 for adjusting a gate voltage Vb_P for each of the Pch transistors connected to the CMOS inverters 11 and 12, and a gate voltage Vb_N for each of the Nch transistors connected to the CMOS inverters 11 and 12, based on the received state information and band information. In addition, the bias generation circuit 22 includes a VT0 detection section 23 for detecting a threshold voltage of a dummy MOS transistor that does not contribute to realizing a frequency division function. Based on the detected threshold voltage, the bias generation circuit 22 adjusts the gate voltage Vb_P for each of the Pch transistors connected to the CMOS inverters 11 and 12, and the gate voltage Vb_N for each of the Nch transistors connected to the CMOS inverters 11 and 12, thereby correcting the individual differences.

Figure 4:
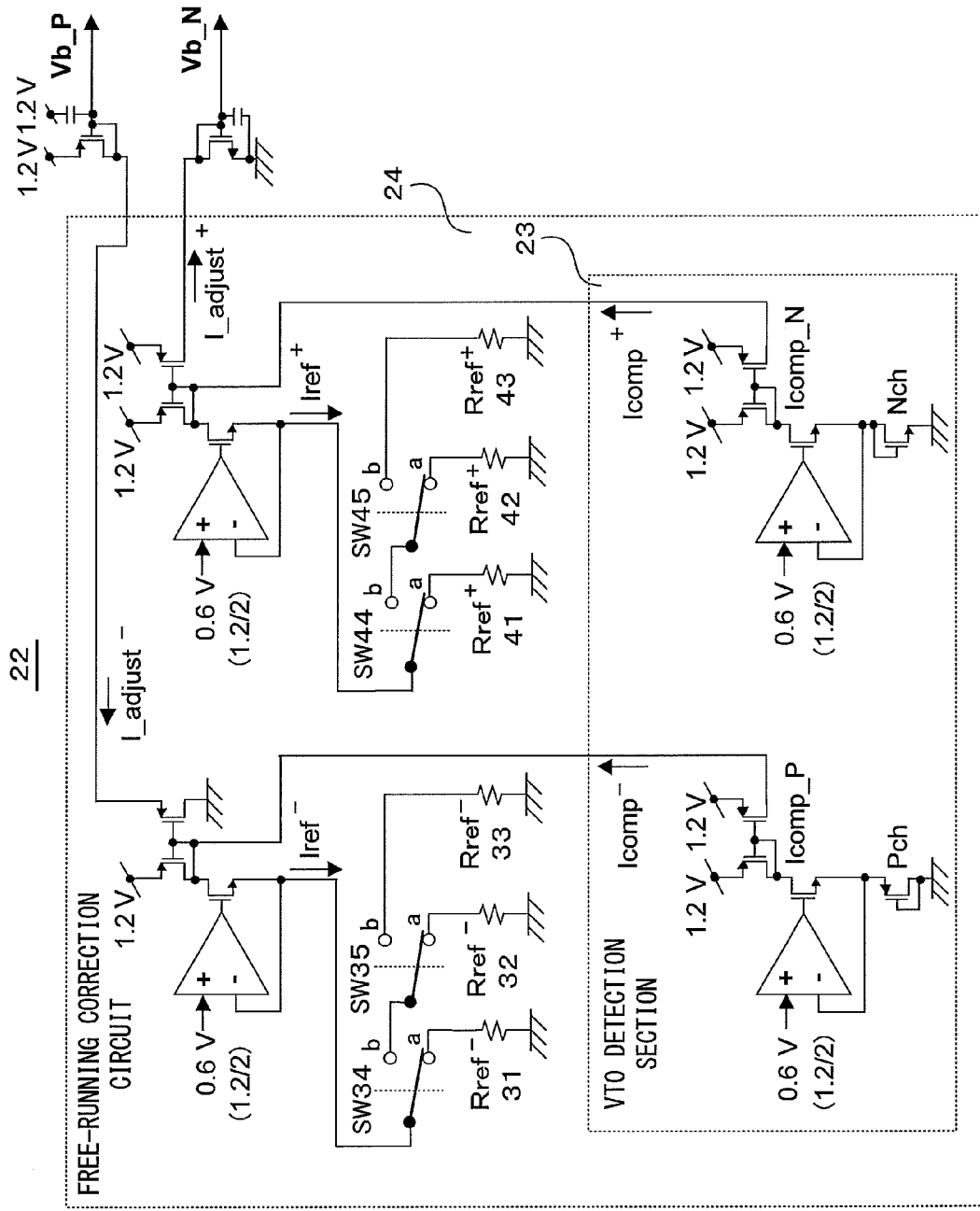
FIG. 4 is a diagram showing an example of an actual circuit configuration of a bias generation circuit 22 shown in FIG. 3.

FIG. 4 is a diagram showing an example of an actual circuit configuration of the bias generation circuit 22 shown in FIG. 3.

With reference to FIG. 4, the free-running frequency varies in proportion to "I_adjust$^+$" and "I_adjust$^-$". Therefore, it is possible to control the free-running frequency by using a free-running correction circuit 24.

In the free-running correction circuit 24, there are relationships of "I_adjust$^+$=Iref$^+$−Icomp$^+$" and "I_adjust$^-$=Iref$^-$−Icomp$^-$". The "Icomp$^+$" and the "Icomp$^-$" include correction amounts corresponding to the variation due to the individual difference of each MOS transistor.

On the other hand, the "Iref$^+$" and the "Iref$^-$" are determined irrespective of the individual difference of the MOS transistor. It is possible to select the values of "Iref$^+$" and "Iref$^-$" by switching "Rref$^+$" among "Rref$^+$31", "Rref$^+$32", and "Rref$^+$33" and switching "Rref$^-$" among "Rref$^-$41", "Rref$^-$42", and "Rref$^-$43". Therefore, in accordance with whether or not the VCO sub band selection is performed or whether the first frequency band or the second frequency band is used in the normal transmission, Rref$^+$ is selectively switched among "Rref$^+$31", "Rref$^+$32", and "Rref$^+$33", and Rref$^-$ is selectively switched among "Rref 41", "Rref 42", and "Rref 43", whereby the free-running frequency can be always kept at the minimum value that is necessary.

Here, the values of "Rref$^+$31", "Rref$^+$32", and "Rref$^+$33" and the values of "Rref$^-$41", "Rref$^-$42", and "Rref$^-$43" are determined by performing a simulation such that the free-running frequency becomes the minimum value that is necessary in accordance with use condition, or by actually measuring the values, based on an appropriate MOS transistor. More specifically, a resistance value that causes, for example, the free-running frequency to be a frequency obtained by adding a margin to the maximum frequency that can be used in the VCO sub band selection so that the free-running frequency is not smaller than the maximum frequency that can be used in the VCO sub band selection, is obtained for each of the Pch transistor and the Nch transistor in advance, and the resistance values are used for the "Rref$^+$31" and the "Rref$^-$41" in the free-running correction circuit 24. In addition, a resistance value that causes, for example, the free-running frequency to be a frequency obtained by adding a margin to the upper limit frequency of the first frequency band in the normal transmission so that the free-running frequency is smaller than the maximum frequency that can be used in the VCO sub band selection and is not smaller than the upper limit frequency of the actual use frequency band, is obtained for each of the Pch transistor and the Nch transistor in advance, and the resistance values are used for the "Rref$^+$32" and the "Rref$^-$42" in the free-running correction circuit 24. Similarly, a resistance value that causes, for example, the free-running frequency to be a frequency obtained by adding a margin to the upper limit frequency of the second frequency band in the normal transmission, is obtained for each of the Pch transistor and the Nch transistor in advance, and the resistance values are used for the "Rre$^+$33" and the "Rref$^-$43" in the free-running correction circuit 24.

If the state information received by the reception section 21 indicates that the VCO sub band selection is performed, contact points a of SW (switch) 34 and SW 44 in the free-running correction circuit 24 are selectively connected, whereby the "Rref$^+$31" and the "Rref$^-$41" are selected, respectively. If the state information indicates that the normal transmission is performed, and the band information received by the reception section 21 indicates that the actual use frequency band is the first frequency band, contact points b of SW 34 and SW 44 are selectively connected, and contact points a of SW 35 and SW 45 are selectively connected, whereby the "Rref$^+$32" and the "Rref$^-$42" are selected, respectively. If the state information indicates that the normal transmission is performed, and the band information indicates that the actual use frequency band is the second frequency band, the contact points b of SW 34 and SW 44 are selectively connected, and contact points b of SW 35 and SW 45 are selectively connected, whereby the "Rref$^+$33" and the "Rref$^-$43" are selected, respectively.

It is noted that in FIG. 4, for the purpose of facilitating the description, mechanical switches are drawn as the switches for the "Rref$^+$31", "Rref$^+$32", "Rref$^+$33", "Rref$^-$41", "Rref$^-$42", and "Rref$^-$43". Actually, it is desirable that the switches are switching devices such as MOS transistors.

In addition, in the present embodiment, only powers to be supplied for driving the first stage and the second stage, which are some of the three CMOS inverters, are switched between the VCO sub band selection and the normal transmission. However, also the current amount at the third stage may be always restricted by using the same circuit as those for the first stage and the second stage, whereby powers to be supplied for driving all the CMOS inverters may be switched.

In addition, the power consumption of the divide-by-2 frequency divider circuit 10 during operation was actually measured in each of the cases where the switching among the "Rref$^+$31", the "Rref$^+$32", and the "Rref$^+$33", and the switching among the "Rref$^-$41", the "Rref$^-$42", and the "Rref$^-$43" were performed in the configuration of the present embodiment, and where the "Rref$^+$31" and the "Rref$^-$41" were fixedly used without switching, and the measured power consumptions were compared. As a result, reduction of the power consumption by more than 10% was recognized in the case of performing the switching.

<Conclusion>

As described above, the CMOS-inverter-type frequency divider circuit according to the first embodiment switches the gate voltages for the Pch transistors and the Nch transistors connected to the CMOS inverters in accordance with whether the VCO sub band selection or the normal transmission is performed, thereby restricting the amounts of currents flowing in the CMOS inverters. Therefore, the power consumption can be largely reduced.

In addition, the CMOS-inverter-type frequency divider circuit according to the first embodiment restricts the current amount in accordance with the actual use frequency band, and eliminates the design margin due to the individual differences of the MOS transistors, thereby further reducing the power consumption.

[Second Embodiment]

<Outlines>

As in the first embodiment, a CMOS-inverter-type frequency divider circuit according to the present embodiment is used for a transmitter of a mobile phone or the like, and supplies as much power as needed depending on time, to each CMOS inverter, thereby realizing reduction of power consumption. In the first embodiment, the gate voltage of the MOS transistor provided in series on the power line of each CMOS inverter is adjusted, whereby the current consumption is restricted. On the other hand, in the present embodiment, the supply voltage for each CMOS inverter is restricted, whereby the power consumption is reduced.

<Configuration>

Figure 5:
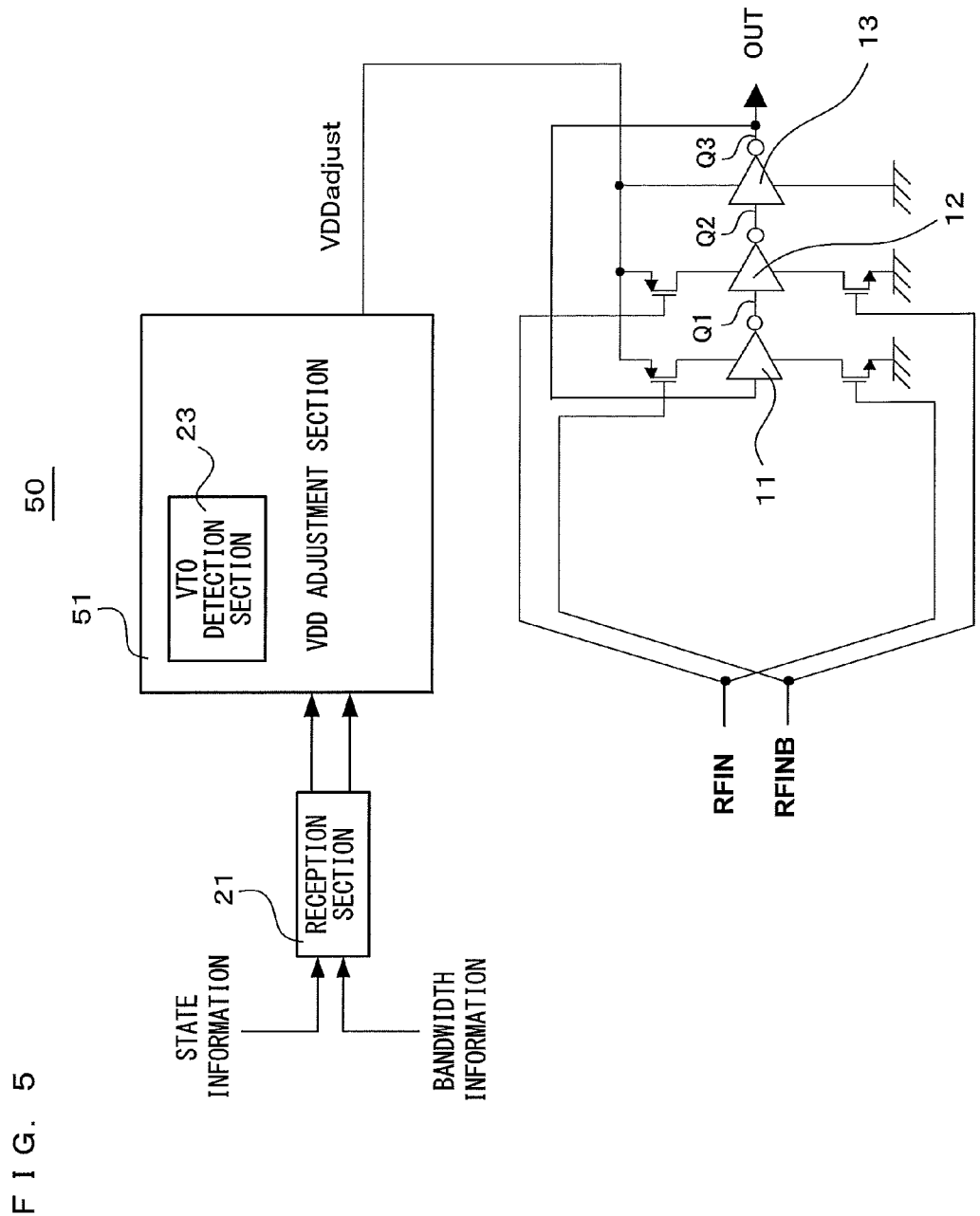
FIG. 5 is a schematic diagram showing a divide-by-2 frequency divider circuit 50 of clocked inverter type according to an embodiment.

FIG. 5 is a schematic diagram showing a divide-by-2 frequency divider circuit 50 of clocked inverter type according to the present embodiment.

It is noted that the same components as those in the first embodiment are denoted by the same reference numerals.

As shown in FIG. 5, in addition to the components of the divide-by-2 frequency divider circuit 10 shown in FIG. 2, the divide-by-2 frequency divider circuit 50 includes: the reception section 21, as in the first embodiment; and a VDD adjustment circuit 51 for adjusting a supply voltage VDDadjust for each of the CMOS inverters 11, 12, and 13 based on the received state information and the received band information, in place of the bias generation circuit 22. The VDD adjustment circuit 51 includes a VT0 detection section 52, and is capable of adjusting the supply voltage for each of the CMOS inverters 11, 12, and 13 based on a threshold voltage detected by the VT0 detection section 52.

Figure 6:
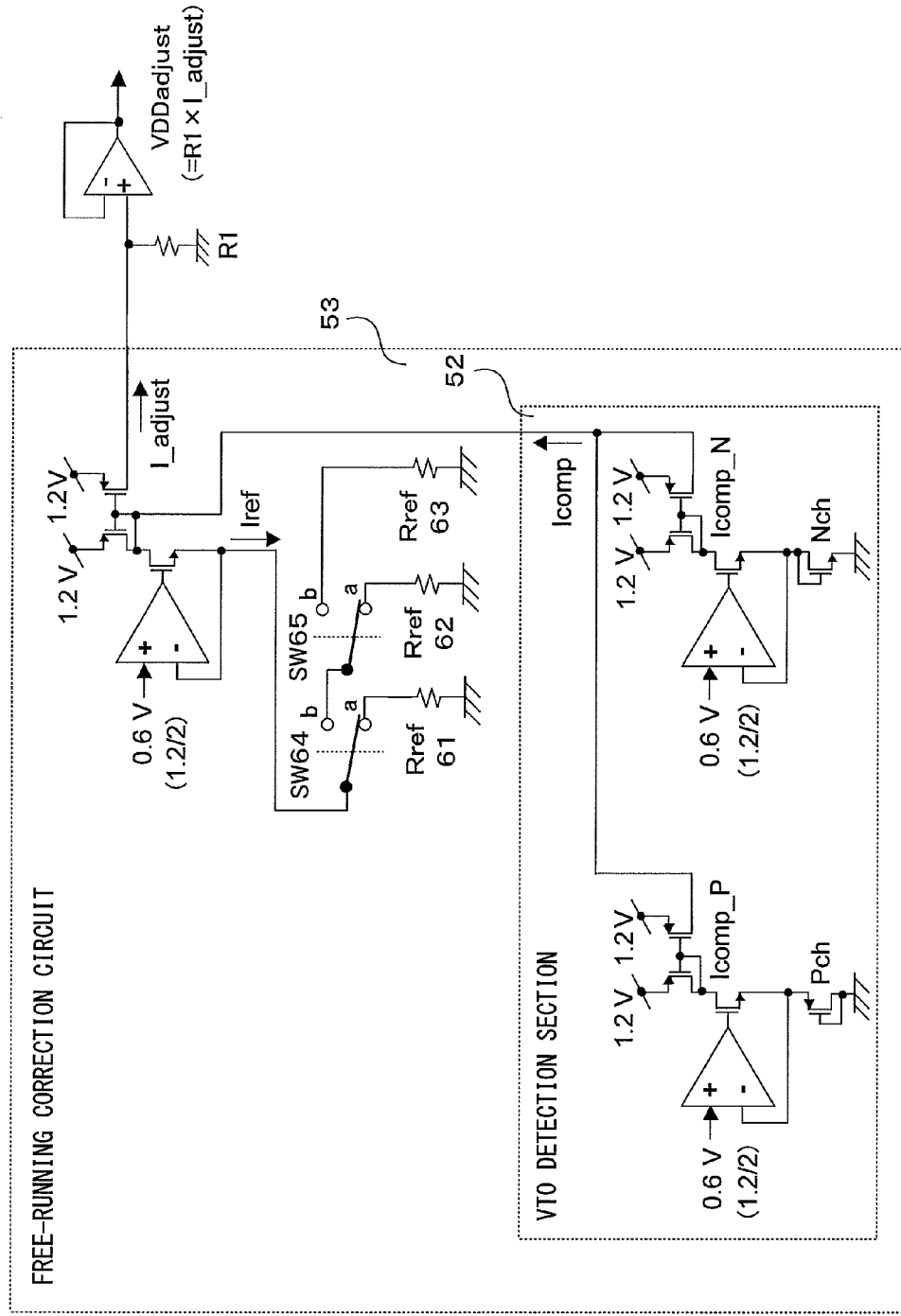
FIG. 6 is a diagram showing an example of an actual circuit configuration of a VDD adjustment circuit 51 shown in FIG. 5.

FIG. 6 is a diagram showing an example of an actual circuit configuration of the VDD adjustment circuit 51 shown in FIG. 5.

With reference to FIG. 6, the free-running frequency varies in proportion to "I_adjust". Therefore, it is possible to control the free-running frequency by using a free-running correction circuit 53.

In the free-running correction circuit 53, there is a relationship of "I_adjust=Iref−Icomp". The "Icomp" includes a correction amount corresponding to the variation due to the individual difference of each MOS transistor.

On the other hand, "Iref" is determined irrespective of the individual difference of the MOS transistor. It is possible to select the value of "Iref" by switching "Rref" among "Rref61", "Rref62", and "Rref63". Therefore, in accordance with whether or not the VCO sub band selection is performed or whether the first frequency band or the second frequency band is used in the normal transmission, Rref is selectively switched among "Rref61", "Rref62", and "Rref63", whereby the free-running frequency can be always kept at the minimum value that is necessary.

Here, the values of "Rref61", "Rref62", and "Rref63" are determined by performing a simulation such that the free-running frequency becomes the minimum value that is necessary in accordance with use condition, or by actually measuring the values, based on an appropriate MOS transistor. More specifically, a resistance value that causes, for example, the free-running frequency to be a frequency obtained by adding a margin to the maximum frequency that can be used in the VCO sub band selection so that the free-running frequency is not smaller than the maximum frequency that can be used in the VCO sub band selection, is obtained in advance, and the resistance value is used for the "Rref61" in the free-running correction circuit 53. In addition, a resistance value that causes the free-running frequency to be a frequency obtained by adding a margin to the upper limit frequency of the first frequency band in the normal transmission so that the free-running frequency is smaller than the maximum frequency that can be used in the VCO sub band selection and is not smaller than the upper limit frequency of the actual use frequency band, is obtained in advance, and the resistance value is used for the "Rref62" in the free-running correction circuit 53. Similarly, a resistance value that causes the free-running frequency to be a frequency obtained by adding a margin to the upper limit frequency of the second frequency band in the normal transmission, is obtained in advance, and the resistance value is used for the "Rref63" in the free-running correction circuit 53.

If the state information received by the reception section 21 indicates that the VCO sub band selection is performed, a contact point a of SW 64 in the free-running correction circuit 53 is selectively connected, whereby the "Rref61" is selected. If the state information indicates that the normal transmission is performed, and the band information received by the reception section 21 indicates that the actual use frequency band is the first frequency band, a contact point b of SW 64 is selectively connected, and a contact point a of SW 65 is selectively connected, whereby the "Rref52" is selected. If the state information indicates that the normal transmission is performed, and the band information indicates that the actual use frequency band is the second frequency band, the contact point b of SW 64 is selectively connected, and a contact point b of SW 65 is selectively connected, whereby the "Rref53" is selected.

It is noted that in the figure, for the purpose of facilitating the description, mechanical switches are drawn as the switches for the "Rref61", "Rref62", and "Rref63". Actually, it is desirable that the switches are switching devices such as MOS transistors.

In addition, the VDD adjustment circuit 51 may use a more efficient power supply such as a switching power supply, to supply a more stable voltage, whereby the power consumption may be further reduced.

<First Modification>

The above-described example of the circuit configuration of the VDD adjustment circuit 51 is a relatively simple one using an analog circuit. It is also possible to efficiently realize the same function as described above, by using a digital circuit.

In the first modification, by performing control using a digital circuit, the same VDD adjustment circuit 51 as in the second embodiment stores in advance an appropriate value of the output voltage corresponding to input information through actual measurement or the like, and outputs an appropriate voltage in accordance with input information in actual use.

In the VDD adjustment circuit 51 of the first modification, the value of the supply voltage VDDadjust is determined by performing a simulation such that the free-running frequency becomes the minimum value that is necessary in accordance with use condition, or by actually measuring the values, based on an appropriate MOS transistor. More specifically, the value of the supply voltage VDDadjust that causes, for example, the free-running frequency to be a frequency obtained by adding a margin to the maximum frequency that can be used in the VCO sub band selection so that the free-running frequency is not smaller than the maximum frequency that can be used in the VCO sub band selection, is obtained and stored in advance. In addition, the value of the supply voltage VDDadjust that causes the free-running frequency to be a frequency obtained by adding a margin to the upper limit frequency of the first frequency band in the normal transmission so that the free-running frequency is smaller than the maximum frequency that can be used in the VCO sub band selection and is not smaller than the upper limit frequency of the actual use frequency band, is obtained and stored in advance. Similarly, the value of the supply voltage VDDadjust that causes the free-running frequency to be a frequency obtained by adding a margin to the upper limit frequency of the second frequency band in the normal transmission, is obtained and stored in advance.

If the state information received by the reception section 21 indicates that the VCO sub band selection is performed, the threshold value is added as a variation amount to the supply voltage VDDadjust for the VCO sub band selection which is stored in advance, and the resultant voltage is outputted. If the state information indicates that the normal transmission is performed, and the band information received by the reception section 21 indicates that the actual use frequency band is the first frequency band, the threshold value is added as a variation amount to the supply voltage VDDadjust for the first frequency band which is stored in advance, and the resultant voltage is outputted. If the state information indicates that the normal transmission is performed, and the band information indicates that the actual use frequency band is the second frequency band, the threshold value is added as a variation amount to the supply voltage VDDadjust for the second frequency band which is stored in advance, and the resultant voltage is outputted.

In the present embodiment, all of powers to be supplied for driving the three CMOS inverters are switched between the VCO sub band selection and the normal transmission. However, only some of the powers to be supplied for driving the three CMOS inverters may be switched. Even in this case, a certain degree of the same effect is obtained.

<Conclusion>

As described above, the CMOS-inverter-type frequency divider circuit according to the second embodiment switches the supply voltages for the CMOS inverters in accordance with whether the VCO sub band selection or the normal transmission is performed, thereby restricting the power consumption in the CMOS inverters. Therefore, the power consumption can be largely reduced.

In addition, the CMOS-inverter-type frequency divider circuit according to the second embodiment restricts the power consumption in accordance with the actual use frequency band, and eliminates the design margin due to the individual differences of the MOS transistors, thereby further reducing the power consumption.

[Explanation of Operation Timing]

Figure 7:
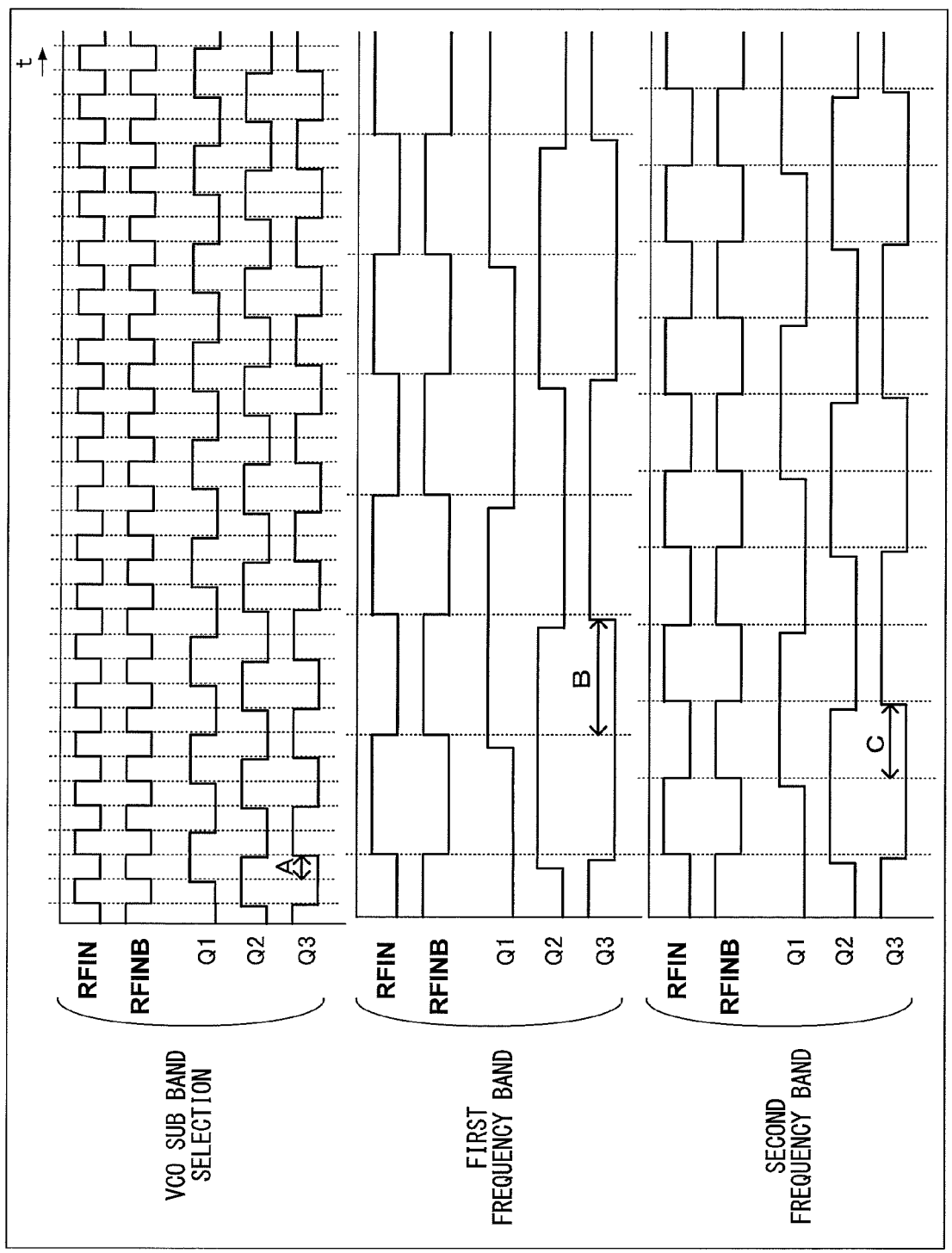
FIG. 7 is a diagram showing the operation timing of the frequency divider circuits of the first embodiment and the second embodiment.

FIG. 7 is a diagram showing the operation timing of the frequency divider circuits of the first embodiment and the second embodiment.

FIG. 7 shows the timings of input and output in, starting from above, the VCO sub band selection, the normal transmission with the first frequency band, and the normal transmission with the second frequency band, together with a common time axis.

Here, it will be assumed that the maximum frequency that can be used in the VCO sub band selection is 4.5 GHz. In addition, it will be assumed that the first frequency band in the normal transmission is a 800 MHz band, and the upper limit frequency thereof is 958 MHz. In addition, it will be assumed that the second frequency band in the normal transmission is a 1.5 GHz band, and the upper limit frequency thereof is 1501 MHz.

In the VCO sub band selection, it is necessary to perform a high-speed operation in which a frequency of 4.5 GHz is outputted. Therefore, if it will be assumed that the margin is about 10%, the "Rref$^+$31" and "Rref$^-$41" in the first embodiment, and the "Rref61" in the second embodiment are determined such that a delay time A in FIG. 7 is a value indicated by the following expression 1. Here, the delay time A corresponds to 90% of a quarter of one period of 4.5 GHz.

$$A = 1/(4.5 \times 10^9 \times 4) \times 0.9 = 50 \times 10^{-12} \text{ [sec]} \quad \text{(Expression 1)}$$

In addition, in the normal transmission with the first frequency band, it is necessary to output a frequency of 958 MHz. Therefore, if it will be assumed that the margin is about 10%, the "Rref$^+$32" and "Rref$^-$42" in the first embodiment, and the "Rref62" in the second embodiment are determined such that a delay time B in FIG. 7 is a value indicated by the following expression 2. Here, the delay time B corresponds to 90% of a quarter of one period of 958 MHz.

$$B = 1/(958 \times 106 \times 4) \times 0.9 = 2.35 \times 10^{-6} \text{ [sec]} \quad \text{(Expression 2)}$$

In addition, in the normal transmission with the second frequency band, it is necessary to output a frequency of 1501 MHz. Therefore, if it will be assumed that the margin is about 10%, the "Rref$^+$33" and "Rref$^-$43" in the first embodiment, and the "Rref63" in the second embodiment are determined such that a delay time C in FIG. 7 is a value indicated by the following expression 3. Here, the delay time B corresponds to 90% of a quarter of one period of 1501 MHz.

$$C = 1/(1501 \times 106 \times 4) \times 0.9 = 1.50 \times 10^{-6} \text{ [sec]} \quad \text{(Expression 3)}$$

INDUSTRIAL APPLICABILITY

The CMOS-inverter-type frequency divider circuit of the present invention is a component that is generally used in a digital circuit. Therefore, the CMOS-inverter-type frequency divider circuit is applicable to various digital apparatuses, besides communication apparatuses. In addition, the CMOS-inverter-type frequency divider circuit can largely reduce power consumption. Therefore, the CMOS-inverter-type frequency divider circuit is suitable to a mobile apparatus such as a mobile phone.

DESCRIPTION OF THE REFERENCE CHARACTERS 10 divide-by-2 frequency divider circuit
11, 12, 13 CMOS inverter
20 divide-by-2 frequency divider circuit
21 reception section
22 bias generation circuit
23 VT0 detection section
24 free-running correction circuit
31, 32, 33 Rref$^+$
34, 35 SW
41, 42, 43 Rref 44, 45 SW
50 divide-by-2 frequency divider circuit
51 VDD adjustment section
52 VTO detection section
53 free-running correction circuit
61, 62, 63 Rref
64, 65 SW
100 mobile phone
101 operation portion
102 open/close portion
103 first display portion
104 second display portion

The invention claimed is:

1. A CMOS-inverter-type frequency divider circuit comprising:
   a plurality of CMOS inverters that contribute to realizing a frequency division function;
   a frequency division control section for performing control such that some or all of the plurality of CMOS inverters are intermittently driven at the respective different timings in accordance with an input signal; and
   a drive power supplying section for supplying powers for driving the plurality of CMOS inverters, and for, based on state information indicating whether VCO sub band selection or normal transmission is performed, switching some or all of the powers for the plurality of CMOS inverters between the VCO sub band selection and the normal transmission,
   wherein the drive power supplying section:
   when the state information indicates that the VCO sub band selection is performed, restricts the powers such that free-running frequencies of the CMOS inverters are not smaller than the maximum frequency that can be used in the VCO sub band selection, and
   when the state information indicates that the normal transmission is performed, restricts the powers such that free-running frequencies of the CMOS inverters are smaller than the maximum frequency that can be used in the VCO sub band selection, and are not smaller than the upper limit frequency of an actual use frequency band.

2. The CMOS-inverter-type frequency divider circuit according to claim 1, wherein
   the drive power supplying section, when the state information indicates that the normal transmission is performed, based on band information indicating whether the actual use frequency band is a first frequency band or a second frequency band, switches, between the first frequency band and the second frequency band, some or all of the powers for the plurality of CMOS inverters such that the free-running frequencies are not smaller than the upper limit frequency of the corresponding one of the first frequency band and the second frequency band.

3. The CMOS-inverter-type frequency divider circuit according claim 1, wherein
   the frequency division control section:
   includes MOS transistors provided in series on power lines of some or all of the plurality of CMOS inverters; and
   performs control such that the plurality of CMOS inverters are intermittently driven at the respective different timings, by alternately and repeatedly applying a high voltage and a low voltage to the gates of the MOS transistors in accordance with the input signal, and
   the drive power supplying section switches the powers by switching a voltage to be applied to the gates between the VCO sub band selection and the normal transmission.

4. The CMOS-inverter-type frequency divider circuit according claim 1, wherein
   the drive power supplying section switches the powers by switching some or all of supply voltages for the plurality of CMOS inverters between the VCO sub band selection and the normal transmission.

5. A CMOS-inverter-type frequency divider circuit comprising:
   a plurality of CMOS inverters that contribute to realizing a frequency division function;
   a frequency division control section for performing control such that some or all of the plurality of CMOS inverters are intermittently driven at the respective different timings in accordance with an input signal; and
   a drive power supplying section for supplying powers for driving the plurality of CMOS inverters, and for, based on state information indicating whether VCO sub band selection or normal transmission is performed, switching some or all of the powers for the plurality of CMOS inverters between the VCO sub band selection and the normal transmission,
   wherein the drive power supplying section:
   includes detection means for detecting a threshold voltage of a dummy MOS transistor that does not contribute to realizing the frequency division function; and
   corrects the individual differences of MOS transistors based on the threshold voltage.

6. A mobile phone comprising:
   the CMOS-inverter-type frequency divider circuit according to claim 1; and
   a communication circuit for realizing a communication function by using the CMOS-inverter-type frequency divider circuit.

7. The CMOS-inverter-type frequency divider circuit according to claim 1, wherein
   the frequency division control section:
   includes MOS transistors provided in series on power lines of some or all of the plurality of CMOS inverters; and
   performs control such that the plurality of CMOS inverters are intermittently driven at the respective different timings, by alternately and repeatedly applying a high voltage and a low voltage to the gates of the MOS transistors in accordance with the input signal, and
   the drive power supplying section switches the powers by switching a voltage to be applied to the gates between the VCO sub band selection and the normal transmission.

8. The CMOS-inverter-type frequency divider circuit according to claim 2, wherein
   the frequency division control section:
   includes MOS transistors provided in series on power lines of some or all of the plurality of CMOS inverters; and
   performs control such that the plurality of CMOS inverters are intermittently driven at the respective different timings, by alternately and repeatedly applying a high voltage and a low voltage to the gates of the MOS transistors in accordance with the input signal, and
   the drive power supplying section switches the powers by switching a voltage to be applied to the gates between the VCO sub band selection and the normal transmission.

9. The CMOS-inverter-type frequency divider circuit according to claim 1, wherein
   the drive power supplying section switches the powers by switching some or all of supply voltages for the plurality of CMOS inverters between the VCO sub band selection and the normal transmission.

10. The CMOS-inverter-type frequency divider circuit according to claim 2, wherein
the drive power supplying section switches the powers by switching some or all of supply voltages for the plurality of CMOS inverters between the VCO sub band selection and the normal transmission.

11. A mobile phone comprising:
the CMOS-inverter-type frequency divider circuit according to claim 1; and
a communication circuit for realizing a communication function by using the CMOS-inverter-type frequency divider circuit.

12. A mobile phone comprising:
the CMOS-inverter-type frequency divider circuit according to claim 2; and
a communication circuit for realizing a communication function by using the CMOS-inverter-type frequency divider circuit.

13. A mobile phone comprising:
the CMOS-inverter-type frequency divider circuit according to claim 3; and
a communication circuit for realizing a communication function by using the CMOS-inverter-type frequency divider circuit.

14. A mobile phone comprising:
the CMOS-inverter-type frequency divider circuit according to claim 4; and
a communication circuit for realizing a communication function by using the CMOS-inverter-type frequency divider circuit.

15. A mobile phone comprising:
the CMOS-inverter-type frequency divider circuit according to claim 5; and
a communication circuit for realizing a communication function by using the CMOS-inverter-type frequency divider circuit.

16. A mobile phone comprising:
the CMOS-inverter-type frequency divider circuit according to claim 7; and
a communication circuit for realizing a communication function by using the CMOS-inverter-type frequency divider circuit.

17. A mobile phone comprising:
the CMOS-inverter-type frequency divider circuit according to claim 8; and
a communication circuit for realizing a communication function by using the CMOS-inverter-type frequency divider circuit.

18. A mobile phone comprising:
the CMOS-inverter-type frequency divider circuit according to claim 9; and
a communication circuit for realizing a communication function by using the CMOS-inverter-type frequency divider circuit.

19. A mobile phone comprising:
the CMOS-inverter-type frequency divider circuit according to claim 10; and
a communication circuit for realizing a communication function by using the CMOS-inverter-type frequency divider circuit.

* * * * *